United States Patent
Umekawa

(10) Patent No.: US 6,594,131 B2
(45) Date of Patent: Jul. 15, 2003

(54) OVER CURRENT PROTECTION CIRCUIT OF SEMICONDUCTOR SWITCHING DEVICE

(75) Inventor: Shinichi Umekawa, Sagamihara (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 217 days.

(21) Appl. No.: 09/768,605

(22) Filed: Jan. 25, 2001

(65) Prior Publication Data

US 2001/0009494 A1 Jul. 26, 2001

(30) Foreign Application Priority Data

Jan. 26, 2000 (JP) ....................................... 2000-017216

(51) Int. Cl.$^7$ ............................................... H02H 3/00
(52) U.S. Cl. ....................... 361/93.7; 361/93.1; 361/98; 327/310
(58) Field of Search ........................ 361/18, 91.1, 91.5, 361/93.3, 93.7, 98; 327/108, 389, 380, 310

(56) References Cited

U.S. PATENT DOCUMENTS 5,396,117 A * 3/1995 Housen et al. ............... 327/480
5,422,593 A * 6/1995 Fujihira ....................... 327/561
5,432,471 A * 7/1995 Majumdar et al. ........... 327/380

OTHER PUBLICATIONS

T. Takeda, et al., "1200V Trench Gate NPT–IGBT(IEGT) with Excellent Low On–State Voltage", Proceedings of 1998 International Symposium on Power Semiconductor Devices & Ics, Kyoto, pp. 75–79.

* cited by examiner

Primary Examiner—Kim Huynh
(74) Attorney, Agent, or Firm—Oblon, Spivak, McClelland, Maier & Neustadt, P.C.

(57) ABSTRACT

In an over current protection circuit of a semiconductor switching device, a change in a main current of a semiconductor switching device with respect to a change in the detected voltage of the resistor for current detection connected to the current detection terminal of the semiconductor switching device becomes gentle in the vicinity of a location where the semiconductor switching device is turned off. With the provision of the current protection circuit, the variation in the cut-off level of the over current with respect to the variation in the detected voltage of the resistor for current detection connected to the current detection terminal of the semiconductor switching device is suppressed so that the semiconductor switching device can be protected from being breakdown due to the over current flow.

17 Claims, 3 Drawing Sheets

OVER CURRENT PROTECTION CIRCUIT OF SEMICONDUCTOR SWITCHING DEVICE

CROSS-REFERENCE TO RELATED APPLICATIONS

This application is based upon and claims the benefit of priority from the prior Japanese Patent Application No. 2000-017216, filed Jan. 26, 2000, the entire contents of which are incorporated herein by reference.

BACKGROUND OF THE INVENTION

The present invention relates to an over current protection circuit of a gate voltage controlled type semiconductor switching device, and more particularly to a control circuit for controlling a semiconductor switching device on the basis of the detected current result, the circuit being used in a semiconductor switching device such as, for example, an IGBT (insulated gate bipolar transistor), a power MOSFET (metal-oxide-silicon field effect transistor) or the like.

The IGBT which is a gate voltage controlled type semiconductor switching device includes an IGBT (a sense IGBT) having a current detection terminal through which a detection current flows in accordance with a main current (a load current).

FIG. 5 shows a basic circuit of a sense IGBT, and FIG. 6 shows a conventional over current protection circuit of the sense IGBT.

In the circuit shown in FIG. 5, reference numeral 10 denotes the sense IGBT. The IGBT comprises a plurality of unit cells having the same structure provided on the same semiconductor chip are divided to be M:1 on the side of the main current element 10a and on the side of detection current element 10b. These unit cells 10a and 10b are connected in parallel to each other.

The gate of the main current element 10a and the gate of the detection current element 10b are connected to the gate terminal 11, and the collector of the main current element 10a and the collector of the detection current element 10b are connected to the collector terminal 12. As a consequence, the ratio of a main current IMAIN flowing through the main current element 10a and a detected current ISENS flowing through the detection current element 10b is equal to the division ratio of the unit cells. In the circuits shown in FIGS. 5 and 6, a current IC denotes a sum of the main current IMAIN and the detected current ISENS.

For over current protection of the IGBT 10, in this embodiment, as shown in FIG. 6, a resistor 15 for current detection is connected between the emitter terminal 13 on the side of the main current element 10a and a current detection terminal (a sense terminal) 14 which is an emitter terminal on the side of the detection current element 10b. Further, an NMOS transistor 50 is connected between the gate of the IGBT 10 and the emitter terminal 13. The NMOS transistor 50 has a drain connected to the gate of the sense IGBT 10, an source connected to one terminal of the current detection resistor 15, a gate connected to the other terminal of the current detection resistor 15, so that a voltage drop (the detected voltage) across the current detection resistor 15 is applied to the gate of the NMOS transistor 50.

In the over current protection circuit shown in FIG. 6, the main current element 10a and the detection current element 10b are shown as a single combined element 10. This is only for the simplicity of the drawing. The main current element 10a and the detection current element 10b are in a form of separate components in the actual circuit structure.

With this circuit structure, it is possible by the NMOS transistor 50 to detect the time when the detected voltage reaches a set value for an over current cut-off. That is, when an over current flows through the sense IGBT 10, the NMOS transistor 50 is turned on, so that the gate voltage of the sense IGBT 10 is decreased to 0V and thus the sense IGBT 10 is turned off.

In the over current protection circuit shown in FIG. 6, a reference numeral 16 denotes a gate resistor connected in series to the gate of the sense IGBT. A reference numeral 17 denotes a diode for a reverse bias prevention connected in a forward direction between a gate of the sense IGBT 10 and a drain of an NMOS transistor 50.

For the current detection resistor 15, the NMOS transistor 50, the gate resistor 16, the diode 17 and the capacitor element 18, individual parts separate from the sense IGBT 10 are used. Alternatively, these circuit components and the IGBT 10 are formed on the same semiconductor chip. Further alternatively, these circuit components are formed on a semiconductor chip for controlling the sense IGBT, separate from the semiconductor chip on which the sense IGBT 10 is formed.

FIG. 7 shows waveforms used for explaining time transition of the over current protection operation of the sense IGBT in the over current protection circuit of FIG. 6.

The gate voltage VG is constant until the detection of the over current of the sense IGBT. At the time of the detection of an over current of the sense IGBT (i.e., when the detected voltage VSENS reaches the over current cut-off set value), the NMOS transistor 50 is turned on, the gate voltage of the sense IGBT 10 is decreased to 0V and the sense IGBT is turned off to cut the main current IMAIN off. As a consequence, it is possible to realize a protection function for preventing the breakdown of the sense IGBT 10 due to the over current.

However, since a voltage drop (the detected voltage VSENS) is generated between an emitter terminal on the side of the main current element 10a and a current detection terminal 14 on the side of the detection current element 10b, the voltage VCE applied between the collector and the emitter of the main current element 10a is different from the voltage VCS applied between the collector and the emitter of the detection current element 10b by the detected voltage VSENS.

That is, the following equation is established.

$$VCS = VCE - VSENS$$

VCS: a voltage between the collector and the current of the detection current element 10b
VCE: a voltage between the collector and the emitter of the main current element 10a
VSENS: detected voltage Consequently, the current which actually flows through the detection current element 10b is smaller than the current of the design value by the division ratio of the unit cells. As the characteristic of the sense IGBT has become improved and the on-voltage has become decreased, the difference between the current actually flows and the current of the design value greatly influences on a difference between a voltage between the collector and the emitter of the main current element 10a and a voltage between the collector and the emitter of the detection current element 10b, and as a result a sufficient detection current ISENS cannot be obtained.

FIG. 8 is a characteristic graph showing relational curves between the detected voltage VSENS in the over current protection circuit shown in FIG. 6 and the main current IMAIN of the sense IGBT.

As can be seen from this characteristic graph, before the characteristic of the sense IGBT has been improved and the on-voltage has been decreased, the correlation between a detected voltage VSENS and the main current IMAIN shows linearity as shown by the characteristic curve I. However, recently, since the characteristic of the sense IGBT has been greatly improved and thus the on-voltage has been largely decreased, the linearity is lost and an abrupt curve as shown by the characteristic curve II is generated.

As a consequence, a variation in the main current IMAIN becomes large with respect to the variation in the detected voltage VSENS and the cut-off level of the over current largely varies, and a sufficient protection function cannot be realized. In the worst case, it is impossible to prevent the breakdown of the sense IGBT 10.

As a countermeasure against such a disadvantage, it is considered that the detected voltage VSENS is lowered by decreasing the value of the current detection resistor 15 in the over current protection circuit, and a difference between a voltage between the collector and the emitter of the main current element 10a and a voltage between the collector and the emitter of the detection current element 10b of the sense IGBT is decreased by lowering the over current cut-off set value. However, with this countermeasure, an error in operation is likely to be generated due to noises.

As has been described above, the conventional over current protection circuit of the sense IGBT has a disadvantage in that the variation in the main current becomes large with respect to the variation in the detected voltage, and the cut-off level of the over current also largely varies and a sufficient protection function cannot be obtained. In the worst cases, it is impossible to prevent the breakdown of the sense IGBT.

BRIEF SUMMARY OF THE INVENTION

The present invention has been made to solve the above mentioned disadvantages, and an object of the invention is to provide an over current protection circuit of a gate voltage controlled type semiconductor switching device which is capable of suppressing a variation in a main current with respect to a variation in a detected voltage, suppressing a variation in the cut-off level of the over current, and thus realizing a sufficient protection function of the semiconductor switching device, by allowing the circuit to be provided with a characteristic that a variation in the main current with respect to a variation in the detected voltage of the current detection resistor connected to a current detection terminal of the gate voltage controlled type semiconductor switching device is gentle in the region where the semiconductor switching device is turned off.

In order to achieve the objection, an over current protection circuit of a semiconductor switching device according to a first aspect of the present invention comprises: a gate voltage controlled type semiconductor switching device having a main current element with a first current output terminal and a detection current element with a second current output terminal; a resistor connected between the first current output terminal and the second current output terminal, for detecting a voltage; and a control circuit connected to a gate terminal of the semiconductor switching device and the resistor, for decreasing a gate voltage applied to the semiconductor switching device when the gate voltage exceeds a first set value larger than the detected voltage detected by the resistor, and cutting off the gate voltage applied to the semiconductor switching device when the gate voltage reaches a predetermined voltage set for a predetermined over current cut-off value.

In the over current protection circuit of a semiconductor switching device according to the first aspect of the present invention, when the detected voltage exceeds a second set value larger than the first set value, the control circuit may decrease the gate voltage applied to the semiconductor switching device in a characteristic curve different from that when the gate voltage exceeds the first set value.

In the over current protection circuit of the semiconductor switching device according to the first aspect of the present invention, the control circuit may comprise a bipolar transistor. The bipolar transistor may be an NPN transistor. The resistor and the bipolar transistor may be formed on the same semiconductor chip. The resistor and the NPN transistor may be formed on the same semiconductor chip.

In the over current protection circuit of the semiconductor switching device according to the first aspect of the present invention, the gate voltage controlled type semiconductor switching device may be an insulation gate bipolar transistor.

In the over current protection circuit of the semiconductor switching device according to the first aspect of the present invention, the gate voltage controlled type semiconductor switching device may be an insulated gate field effect transistor.

In the over current protection circuit of the semiconductor switching device according to the first aspect of the present invention, the control circuit may comprise a bipolar transistor one output terminal of which is connected to the first current output terminal, a diode connected between the other output terminal of the bipolar transistor and the gate terminal of the semiconductor switching device, and a capacitor connected between a base terminal of the bipolar transistor and the other output terminal of the bipolar transistor.

In the over current protection circuit of the semiconductor switching device according to the first aspect of the present invention, the over current protection circuit may further comprise a gate resistor connected in series with the gate terminal of the semiconductor switching device.

An over current protection circuit of a semiconductor switching device according to a second aspect of the present invention comprises: a gate voltage controlled type semiconductor switching device having a main current element with a first current output terminal and a detection current element with a second current output terminal; a resistor connected between the first current output terminal and the second current output terminal, for detecting a voltage; and a control circuit connected to a gate terminal of the semiconductor switching device and the resistor, for decreasing a gate voltage applied to the semiconductor switching device in a characteristic curve when the gate voltage exceeds a first set value larger than the detected voltage detected by the resistor, decreasing the gate voltage in a different characteristic curve when the gate voltage exceeds a second set value larger than the first set value, successively decreasing the gate voltage in further different characteristic curves when the gate voltage successively exceeds further higher set values, and cutting off the gate voltage when the gate voltage reaches a predetermined voltage set for a predetermined over current cut-off value.

In the over current protection circuit of the semiconductor switching device according to the second aspect of the present invention, the control circuit may comprise a bipolar transistor. The bipolar transistor may be an NPN transistor. The resistor and the bipolar transistor may be formed on the same semiconductor chip. The resistor and the NPN transistor may be formed on the same semiconductor chip.

In the over current protection circuit of the semiconductor switching device according to the second aspect of the present invention, the gate voltage controlled type semiconductor switching device may be an insulated gate bipolar transistor.

In the over current protection circuit of the semiconductor switching device according to the second aspect of the present invention, the gate voltage controlled type semiconductor switching device may be an insulated gate field effect transistor.

In the over current protection circuit of the semiconductor switching device according to the second aspect of the present invention, the control circuit may comprise a bipolar transistor one output terminal of which is connected to the first current output terminal, a diode connected between the other output terminal of the bipolar transistor and the gate terminal of the semiconductor switching device, and a capacitor connected between a base terminal of the bipolar transistor and the other output terminal of the bipolar transistor.

In the over current protection circuit of the semiconductor switching device according to the second aspect of the present invention, the over current protection circuit may further comprise a gate resistor connected in series with the gate terminal of the semiconductor switching device.

An over current protection circuit of a semiconductor switching device according to a third aspect of the present invention comprises: a gate voltage controlled type semiconductor switching device having a main current element with a first current output terminal through which a main current flows, and a detection current element with a second current output terminal through which a detection current flows in correspondence to the main current; a resistor for current detection connected between the current output terminal of the main current element and the current output terminal of the detection current element for generating a voltage drop generated by the current flowing through the detection current element; and a control circuit connected to a gate terminal of the semiconductor switching device and the resistor, for decreasing a gate voltage applied to the semiconductor switching device in a first characteristic curve when the gate voltage exceeds a first set value larger than the detected voltage at the time of the detection of the rated current of the semiconductor switching device, and cutting off the main current when the gate voltage reaches a predetermined voltage set for a predetermined current value larger than a current value set for the first set voltage value.

In the over current protection circuit of a semiconductor switching device according to the third aspect of the present invention, when the detected voltage exceeds a second set value larger than the first set value, the control circuit may decrease the gate voltage in a second characteristic curve different from the first characteristic curve.

In the over current protection circuit of the semiconductor switching device according to the third aspect of the present invention, the control circuit may comprise an NPN transistor. The current detection resistor and the NPN transistor may be formed on the same semiconductor chip.

In the over current protection circuit of the semiconductor switching device according to the third aspect of the present invention, the gate voltage controlled type semiconductor switching device may be an insulation gate bipolar transistor.

In the over current protection circuit of the semiconductor switching device according to the third aspect of the present invention, the gate voltage controlled type semiconductor switching device may be an insulation gate field effect transistor.

An over current protection circuit of a semiconductor switching device according to a fourth aspect of the present invention comprises: a gate voltage controlled type semiconductor switching device having a main current element with a first current output terminal through which a main current flows, and a detection current element with a second current output terminal through which a detection current flows in correspondence to the main current; a resistor for current detection connected between the current output terminal of the main current element and the current output terminal of the detection current element for generating a voltage drop generated by the current flowing through the detection current element; and a control circuit connected to a gate terminal of the semiconductor switching device and the resistor, for decreasing a gate voltage applied to the semiconductor switching device in a first characteristic curve when the gate voltage exceeds a first set value larger than the detected voltage at the time of the detection of the rated current of the semiconductor switching device, decreasing the gate voltage in a different characteristic curve when the gate voltage exceeds a second set value larger than the first set value, successively decreasing the gate voltage in further different characteristic curves when the gate voltage successively exceeds further higher set values, and cutting off the main current when the gate voltage reaches a predetermined voltage set for a predetermined over current cut-off value.

In the over current protection circuit of the semiconductor switching device according to the fourth aspect of the present invention, the control circuit may comprise an NPN transistor. The current detection resistor and the NPN transistor may be formed on the same semiconductor chip.

In the over current protection circuit of the semiconductor switching device according to the fourth aspect of the present invention, the gate voltage controlled type semiconductor switching device may be an insulation gate bipolar transistor.

In the over current protection circuit of the semiconductor switching device according to the fourth aspect of the present invention, the gate voltage controlled type semiconductor switching device may be an insulation gate field effect transistor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
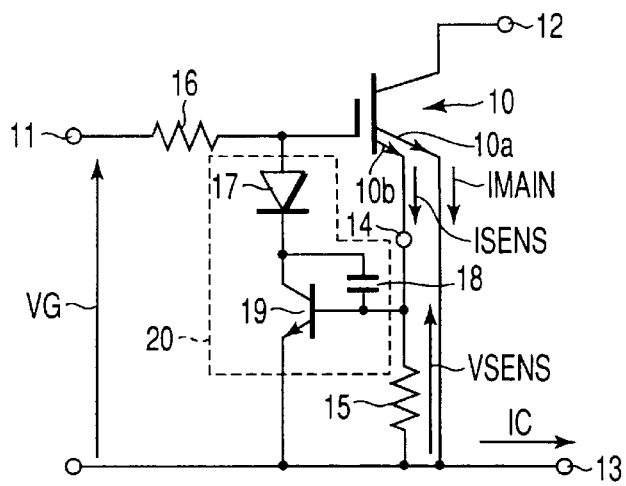
FIG. 1 is a circuit diagram showing an over current protection circuit of a sense IGBT according to a first embodiment of the present invention.

Embodiments of the present invention will be explained by referring to the drawings.

FIG. 1 is a circuit diagram showing an example of an over current protection circuit using a sense IGBT according to a first embodiment of the present invention.

Figure 6:
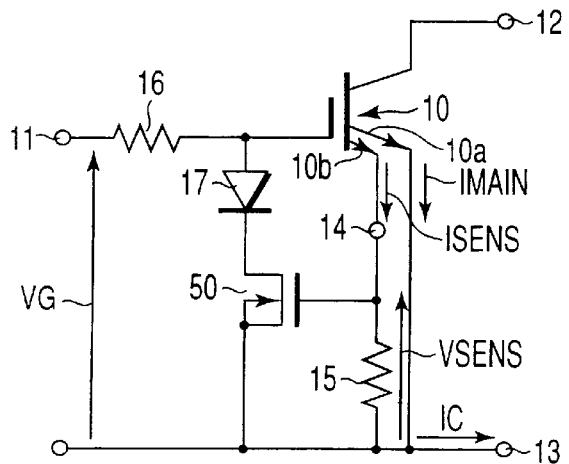
FIG. 6 is a circuit diagram showing a conventional over current protection circuit of a sense IGBT.
Figure 7:
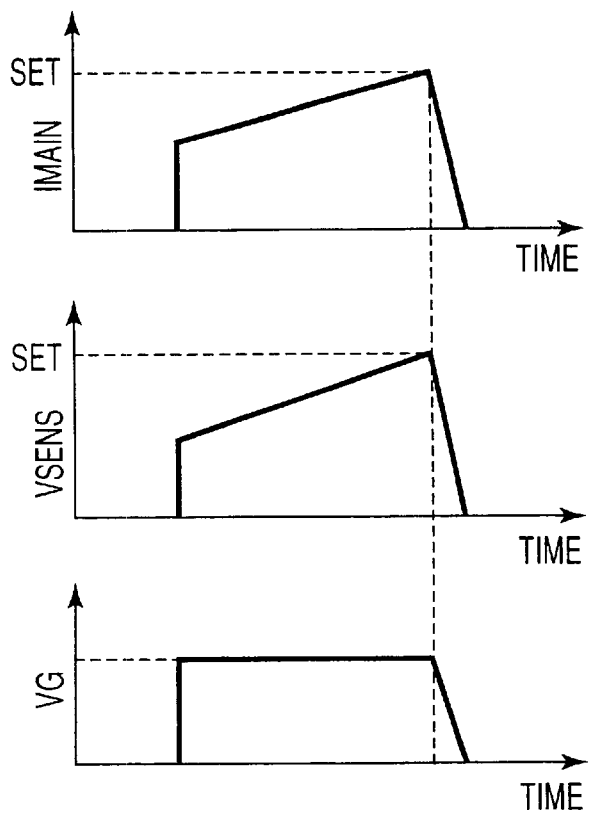
FIG. 7 is a waveform used for explaining time transition of the over current protection operation of the over current protection circuit of the sense IGBT shown in FIG. 6.

The difference between the over current protection circuit of the sense IGBT shown in FIG. 1 and the conventional over current protection circuit of the sense IGBT shown in FIG. 6 resides in the control circuit for controlling the sense IGBT based on the detected voltage VSENS. The other parts or portions are the same as those in the current protections circuits in FIGS. 1 and 6, and thus the same parts or portions are denoted by same or corresponding reference numerals used in the current protections circuits in FIGS. 1 and 6.

A control circuit 20 comprises a reverse bias preventing diode 17, a capacitor element 18, and an NPN transistor 19.

Figure 5:
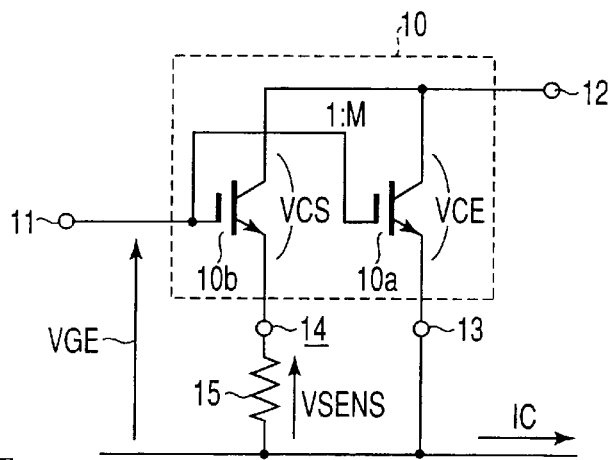
FIG. 5 is a basic circuit of a sense IGBT.

In the over current protection circuit shown in FIG. 1, reference numeral 10 denotes the sense IGBT. Describing the sense IGBT with reference to FIG. 5, the IGBT comprises a plurality of unit cells having the same structure provided on the same semiconductor chip are divided to be M:1 on the side of the main current element 10a and on the side of detection current element 10b. These unit cells 10a and 10b are connected in parallel to each other.

The gate of the main current element 10a and the gate of the detection current element 10b are connected to the gate terminal 11, and the collector of the main current element 10a and the collector of the detection current element 10b are connected to the collector terminal 12. As a consequence, the ratio of a min current flowing through the main current element 10a and a detected current ISENS flowing through the detection current element 10b is equal to the division ratio of the unit cells.

For over current protection of the IGBT, in this embodiment, as shown in FIG. 1, a resistor 15 for current detection is connected between the emitter terminal 13 on the side of the main current element 10a and a current detection terminal (a sense terminal) 14 which is an emitter terminal on the side of the detection current element 10b. Further, an NPN transistor 19 is connected between the gate of the IGBT 10 and the emitter terminal 13. The NPN transistor 19 has a collector connected to the gate of the sense IGBT 10, an emitter connected to one terminal of the current detection resistor 15, a base connected to the other terminal of the current detection resistor 15, so that a voltage drop (the detected voltage) across the current detection resistor 15 is applied to the base of the NPN transistor 19.

In FIG. 1, the main current element 10a and the detection current element 10b are shown as a single combined element 10. This is only for the simplicity of the drawing. The main current element 10a and the detection current element 10b are in a form of separate components in the actual circuit structure. In the circuit shown in FIG. 1, a current IC denotes a sum of the main current IMAIN and the detected current ISENS.

Also in FIG. 1, reference numeral 16 denotes a gate resistor connected in series to the gate of the sense IGBT 10, reference numeral 17 denotes a diode for reverse bias prevention connected in a forward direction between the gate of the sense IGBT 10 and the collector of the NPN transistor 19, and reference numeral 18 denotes a capacitor element connected between the collector and the base of the NPN transistor 19.

For the current detection resistor 15, the NPN transistor 19, the gate resistor 16, the diode 17 and the capacitor element 18, individual parts separate from the sense IGBT 10 may be used. Alternatively, these circuit components and the IGBT 10 may be formed on the same semiconductor chip. Further alternatively, these circuit components may be formed on a semiconductor chip for controlling the sense IGBT, separate from the semiconductor chip on which the sense IGBT 10 is formed.

Figure 2:
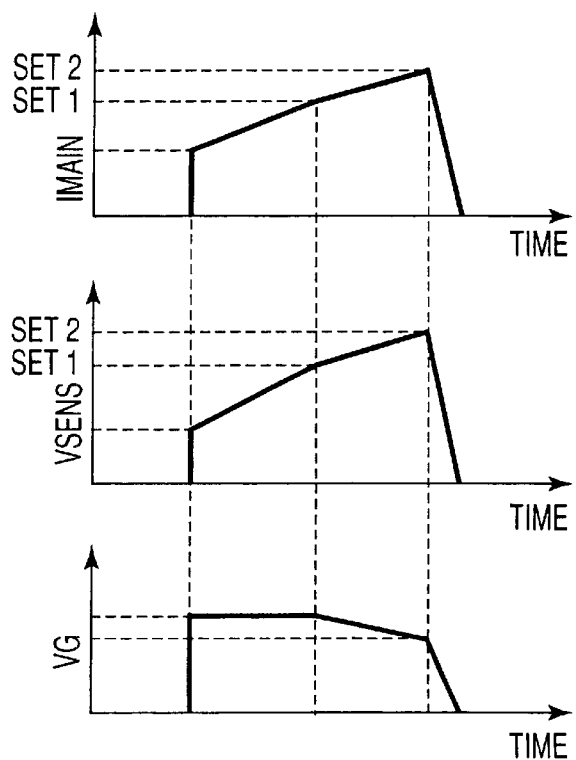
FIG. 2 is a waveform used for explaining time transition of an over current protection operation of the over current protection circuit of the sense IGBT shown in FIG. 1.

FIG. 2 shows waveforms used for explaining time transition of the over current protection operation of the sense IGBT in the over current protection circuit of FIG. 1. Here, there is shown an example in which the set voltage of the current protection is set in two stages.

In the current protection circuit shown in FIG. 1, when the main current IMAIN of the sense IGBT 10 increases and the detected voltage VSENS applied to the base of the NPN transistor 19 reaches the first voltage set value at SET1 larger than the detected voltage VSENS at the time of the rated current of the sense IGBT 10, then the NPN transistor 19 decreases the gate voltage VG of the sense IGBT 10 in a first characteristic curve of an inclination to suppress an increase in the main current IMAIN of the sense IGBT 10.

When the main current IMAIN of the sense IGBT 10 further increases and the detected voltage VSENS reaches a predetermined second voltage set value at SET2 set for an over current cut-off larger than the rated current, the gate voltage VG of the sense IGBT 10 is decreased to 0V to cut off the main current IMAIN of the sense IGBT 10. The set voltage values for SET1 and SET2 are determined based on various factors in designing the protection circuit. The voltage values for SET1 and SET2 are determined based on various factors in designing the protection circuit.

There will now be described in detail a time transition of the over current protection operation of the sense IGBT.

As shown in FIG. 2, the gate voltage VG of the sense IGBT 10 is constant within the normally used current range (the rated current) of the sense IGBT 10. When the main current IMAIN of the sense IGBT 10 increases and exceeds the rated current, and the detected voltage VSENS reaches the first voltage set value at SET1 larger than the detected voltage VSENS at the time of the rated current of the sense IGBT 10, then the base current of the NPN transistor 19 increases, the voltage between the collector and the emitter of the NPN transistor 19 decreases, and the gate voltage VG of the sense IGBT 10 is decreased to suppress the increase in the main current IMAIN.

When the main current IMAIN of the sense IGBT 10 further increases and the detected voltage VSENS reaches the predetermined second voltage set value at SET2 for the over current cut-off set value, then the NPN transistor 19 is turned on to decrease the gate voltage VG of the sense IGBT 10 to 0V, and the sense IGBT 10 is turned off. In this way, the protection function for preventing the breakdown due to the over current of the sense IGBT 10 can be realized.

Figure 8:
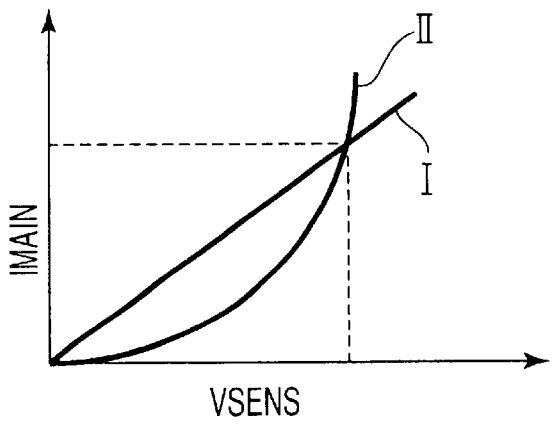
FIG. 8 is a characteristic graph showing relational curves between the detected voltage of the over current protection circuit shown in FIG. 6 and the main current IMAIN of the sense IGBT.

With the circuit operation described above, the dependency of the main current IMAIN of the IGBT on the detected voltage VSENS has a characteristic curve close to a linear curve in the region between the set values for SET1 and SET2, as shown by the characteristic curve I in FIG. 8.

Figure 3:
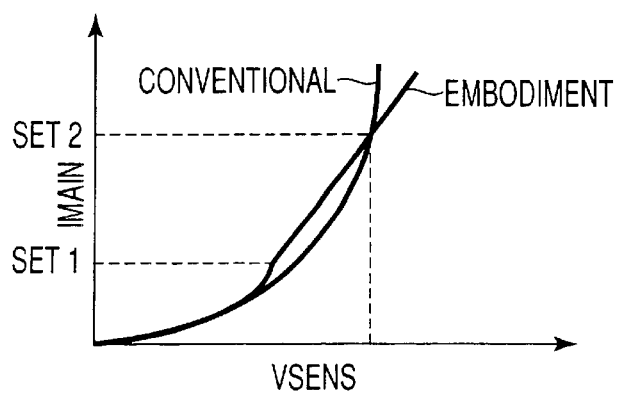
FIG. 3 is a characteristic graph showing a relational curve between a detected voltage of the over current protection circuit of the embodiment shown in FIG. 1 and a main current IMAIN of the sense IGBT and a relational curve between a detected voltage of the conventional over current protection circuit shown in FIG. 6 and a main current IMAIN of the sense IGBT.

FIG. 3 is a characteristic graph showing a relational curve labeled "EMBODIMENT" between the detected voltage VSENS and the main current IMAIN of the sense IGBT 10 in the over current protection circuit shown in FIG. 1. For comparison, FIG. 3 also shows another relational curve labeled "CONVENTIONAL" between the detected voltage VSENS and the main current IMAIN of the sense IGBT 10 in the over current protection circuit shown in FIG. 6.

As shown in FIG. 3, since the detected voltage VSENS can be obtained in a gentle portion of the characteristic curve in a region where the main current IMAIN is small, then a variation in the main current IMAIN is small. When the main current IMAIN of the sense IGBT 10 increases and exceeds the rated current, the base current of the NPN transistor 19 increases, and the voltage between the collector and the emitter of the NPN transistor 19 decreases thereby decreasing the gate voltage VG of the sense IGBT 10 to suppress the increase of the main current IMAIN. When the main current IMAIN of the sense IGBT 10 further increases and the detected voltage VSENS reaches the predetermined voltage at SET2 set for the over current cut-off set value, then the NPN transistor 19 is turned on to decrease the gate voltage VG of the sense IGBT 10 to 0V, and the sense IGBT 10 is turned off. With the operation described above, in a region of the characteristic curve in the vicinity of the point where the main current IMAIN of the sense IGBT exceeds the rated current, the characteristic curve of the main current IMAIN of the embodiment of the present invention is gentle as compared with the conventional characteristic curve. Thus, the variation in the cut-off level of the main current IMAIN of the sense IGBT can be suppressed, thereby making it possible to prevent the breakdown of the sense IGBT.

In the over current protection circuit of the sense IGBT 10 of the above mentioned embodiment, a change in the main current IMAIN with respect to the change in the voltage VSENS detected by the voltage detection resistor 15 connected to the current detection terminal 14 of the sense IGBT 10 is gentle in the region where the sense IGBT 10 is turned off. As a consequence, the variation in the main current IMAIN with respect to the variation in the detected voltage VSENS can be suppressed and the variation in the cut-off level of the over current can be suppressed. Thus, the protection function of the sense IGBT 10 is enhanced.

As another example of the over current protection operation of the sense IGBT 10 shown in FIG. 1, the characteristic of the detected voltage to the main current IMAIN may be changed so that the set voltage for VSENS can be set in three or more stages. For example, in the three stage system, when the detected voltage VSENS exceeds a first set value larger than the detected voltage at the time of the rated current of the sense IGBT 10, the gate voltage VG of the sense IGBT is lowered in a first characteristic curve with an inclination to suppress the increase of the main current IMAIN of the sense IGBT 10, when the detected voltage VSENS exceeds a second set value larger than the first set value, the gate voltage VG of the sense IGBT is further lowered in a second characteristic curve whose inclination is different from the first characteristic curve to further suppress the increase of the main current IMAIN of the sense IGBT 10, and when the detected voltage VSENS reaches an over current cut-off set value, the gate voltage is abruptly decreased to a minimum value to cut the main current IMAIN of the sense IGBT 10 off. Also in this embodiment, similar advantages to those in the first embodiment can be obtained.

The present invention is not limited to the over current protection circuit of the sense IGBT, and the invention can be also applied to the over current protection circuit of the other semiconductor switching device of an insulation gate type.

Figure 4:
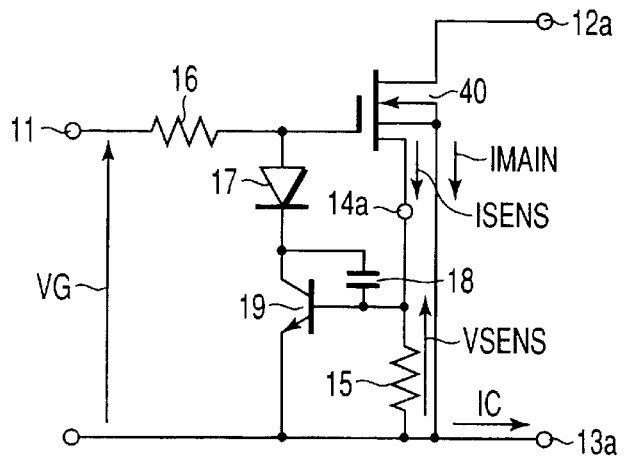
FIG. 4 is a circuit diagram showing an over current protection circuit of a power MOSFET according to a second embodiment of the present invention.

FIG. 4 shows another over current protection circuit using a power MOSFET according to a second embodiment of the present invention. In this embodiment, a power MOSFET 40 having a current detection terminal is used in place of the sense IGBT 10 of FIG. 1.

In the over current protection circuit shown in FIG. 4, a reference numeral 12a denotes a drain terminal, a reference numeral 13a denotes a source terminal, a reference numeral 14a denotes a sense terminal (a source terminal). The other parts or portions are the same as those in the over current protection circuit shown in FIG. 1, and denoted with the same reference numerals as those used in the over current protection circuit shown FIG. 1. Also in this embodiment, the same advantages as those obtained in the first embodiment can be obtained.

As described above, according to the over current protection circuit of the semiconductor switching device of the present invention, the variation of the main current with respect to the variation of the detected voltage can be suppressed, and the variation of the cut-off level of the over current can be suppressed so that the protection function of the semiconductor switching device is enhanced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An over current protection circuit of a semiconductor switching device comprising:
   a gate voltage controlled type semiconductor switching device having a main current element with a first current output terminal and a detection current element with a second current output terminal;
   a resistor connected between the first current output terminal and the second current output terminal, for detecting a voltage; and
   a control circuit connected to a gate terminal of the semiconductor switching device and the resistor, for decreasing a gate voltage applied to the semiconductor switching device when the voltage detected by the resistor exceeds a first set value, and cutting off the gate voltage applied to the semiconductor switching device when the gate voltage reaches a predetermined voltage set for a predetermined over current cut-off value, the control circuit comprising a bipolar transistor one output terminal of which is connected to the first current output terminal, a diode connected between the other output terminal of the bipolar transistor and the gate terminal of the semiconductor switching device, and a capacitor connected between a base terminal of the bipolar transistor and said other output terminal of the bipolar transistor.

2. An over current protection circuit of a semiconductor switching device according to claim 1, wherein when the detected voltage exceeds a second set value larger than the first set value, the control circuit decreases the gate voltage applied to the semiconductor switching device in a characteristic curve different from that when the gate voltage exceeds the first set value.

3. An over current protection circuit of the semiconductor switching device according to claim 1, wherein the control circuit comprises a bipolar transistor.

4. An over current protection circuit of the semiconductor switching device according to claim 3, wherein the bipolar transistor is an NPN transistor.

5. An over current protection circuit of the semiconductor switching device according to claim 4, wherein the control circuit is formed on the same semiconductor chip on which the gate voltage controlled type semiconductor switching device is formed.

6. An over current protection circuit of the semiconductor switching device according to claim 3, wherein the control circuit is formed on the same semiconductor chip on which the gate voltage controlled type semiconductor switching device is formed.

7. An over current protection circuit of the semiconductor switching device according to claim 1, wherein the gate voltage controlled type semiconductor switching device is an insulation gate bipolar transistor.

8. An over current protection circuit of the semiconductor switching device according to claim 1, wherein the gate voltage controlled type semiconductor switching device is an insulated gate field effect transistor.

9. An over current protection circuit of the semiconductor switching device according to claim 1, wherein the over current protection circuit further comprises a gate resistor connected in series with the gate terminal of the semiconductor switching device.

10. An over current protection circuit of a semiconductor switching device according to claim 1, wherein the first set value is larger than the voltage detected by the resistor when a rated current flows through the main current element.

11. An over current protection circuit of a semiconductor switching device comprising:

a gate voltage controlled type semiconductor switching device having a main current element with a first current output terminal through which a main current flows, and a detection current element with a second current output terminal through which a detection current flows in correspondence to the main current;

a resistor for current detection connected between the current output terminal of the main current element and the current output terminal of the detection current element for generating a voltage drop generated by the current flowing through the detection current element; and a control circuit connected to a gate terminal of the semiconductor switching device and the resistor, for decreasing a gate voltage applied to the semiconductor switching device in a first characteristic curve when the voltage detected by the resistor exceeds a first set value, and cutting off the main current when the gate voltage reaches a predetermined voltage set for a predetermined current value larger than a current value set for the first set voltage value, the control circuit comprising a bipolar transistor one output terminal of which is connected to the first current output terminal, a diode connected between the other output terminal of the bipolar transistor and the gate terminal of the semiconductor switching device, and a capacitor connected between a base terminal of the bipolar transistor and said other output terminal of the bipolar transistor.

12. An over current protection circuit of a semiconductor switching device according to claim 11, wherein when the detected voltage exceeds a second set value larger than the first set value, the control circuit decreases the gate voltage in a second characteristic curve different from the first characteristic curve.

13. An over current protection circuit of the semiconductor switching device according to claim 11, wherein the control circuit comprises an NPN transistor.

14. An over current protection circuit of the semiconductor switching device according to claim 13, wherein the control circuit is formed on the same semiconductor chip on which the gate voltage controlled type semiconductor switching device is formed.

15. An over current protection circuit of the semiconductor switching device according to claim 11, wherein the gate voltage controlled type semiconductor switching device is an insulation gate bipolar transistor.

16. An over current protection circuit of the semiconductor switching device according to claim 11, wherein the gate voltage controlled type semiconductor switching device is an insulation gate field effect transistor.

17. An over current protection circuit of a semiconductor switching device according to claim 11, wherein the first set value is larger than the voltage detected by the resistor when a rated current flows through the main current element.

* * * * *